US007839669B2

United States Patent
Hoya

(10) Patent No.: US 7,839,669 B2
(45) Date of Patent: Nov. 23, 2010

(54) SEMICONDUCTOR MEMORY DEVICE

(75) Inventor: Katsuhiko Hoya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 229 days.

(21) Appl. No.: 12/253,582

(22) Filed: Oct. 17, 2008

(65) Prior Publication Data

US 2009/0103349 A1 Apr. 23, 2009

(30) Foreign Application Priority Data

Oct. 19, 2007 (JP) ............................. 2007-272102

(51) Int. Cl.
  G11C 11/22 (2006.01)
  G11C 7/00 (2006.01)
  G11C 7/02 (2006.01)
(52) U.S. Cl. ...................... 365/145; 365/205; 365/207; 365/210.1
(58) Field of Classification Search ................ 365/145, 365/205, 207, 210.1
  See application file for complete search history.

(56) References Cited

U.S. PATENT DOCUMENTS 6,081,461 A * 6/2000 Shirley et al. ............... 365/190
6,822,891 B1 * 11/2004 Hoya et al. .................. 365/145
7,269,048 B2 9/2007 Takashima
2003/0099125 A1 * 5/2003 Kang ......................... 365/145
2004/0252542 A1 * 12/2004 Hoya et al. .................. 365/145
2005/0002247 A1 * 1/2005 Kamoshida et al. ......... 365/201
2007/0183232 A1 * 8/2007 Okada ........................ 365/201

FOREIGN PATENT DOCUMENTS

JP 2001-250376 9/2001
JP 2005-4811 1/2005

* cited by examiner

Primary Examiner—Ly D Pham
(74) Attorney, Agent, or Firm—Oblon, Spivak, McClelland, Maier & Neustadt, L.L.P.

(57) ABSTRACT

A first memory cell array includes a first bit line and a second bit line arranged to read data out of a memory cell containing a ferroelectric capacitor. A second memory cell array includes a third bit line and a fourth bit line arranged to read data out of a memory cell containing a ferroelectric capacitor. A sense amp circuit detects and amplifies a potential difference caused between any two of the first through fourth bit lines. A decoupling circuit selectively connects any two of the first through fourth bit lines to the sense amp circuit and decouples the remainder from the sense amp circuit. A bit-line potential control circuit is arranged between the decoupling circuit and the first and second memory cell arrays to fix the bit lines decoupled from the sense amp circuit by the decoupling circuit to a first potential.

14 Claims, 7 Drawing Sheets

SEMICONDUCTOR MEMORY DEVICE

CROSS-REFERENCE TO RELATED APPLICATION

This application is based on and claims the benefit of priority from prior Japanese Patent Application No. 2007-272102, filed on Oct. 19, 2007, the entire contents of which are incorporated herein by reference.

BACKGROUND OF THE INVENTION

1. Field of the Invention

The present invention relates to a semiconductor memory device, and more particularly to a ferroelectric memory comprising memory cells each containing a ferroelectric capacitor and a transistor.

2. Description of the Related Art

A ferroelectric memory (FeRAM) is such a semiconductor memory device that utilizes the hysteresis characteristic of a ferroelectric capacitor to store data nonvolatile in accordance with magnitudes of two different polarized states of the ferroelectric.

A memory cell in the conventional ferroelectric memory generally uses the architecture similar to that of a DRAM, which comprises a ferroelectric capacitor replaced with a paraelectric capacitor, and a selection transistor serially connected to the ferroelectric capacitor (see JP 2001-250376A, for example). Plural such memory cells are arranged in grid to configure a memory cell array. In data reading, a word line (selection line) associated with a memory cell targeted for read is activated by turning on a selection transistor to connect the memory cell to a bit line.

A cell transistor and a ferroelectric memory are connected in parallel to configure one memory cell and such memory cells are serially connected to configure a memory cell block in a ferroelectric memory of the so-called TC parallel unit serial connection type as known (see JP 2005-4811A, for example). In the ferroelectric memory of the TC parallel unit serial connection type, each memory cell block can be connected to a bit line when a block selection transistor having a gate connected to a block selection line (selection line) turns on.

In either the DRAM-analogous structure or the structure of the TC parallel unit serial connection type, the ferroelectric memory may adopt a 2-transistor/2-cell system (2T2C system) that uses two memory cells for reading complementary data, and a 1-transistor/1-cell system (1T1C system) that uses one memory cell for reading.

One having the DRAM-analogous structure is described by way of example. In the 2T2C system, the word line connected to a read-targeted memory cell and the word line associated with a complementary memory cell that holds complementary data are selected to connect the memory cell to a bit line and the complementary memory cell to a complementary bit line.

Thereafter, a plate voltage is applied to a plate line, and a voltage is applied across the ferroelectric capacitors contained in the read-targeted and complementary memory cells. The charge on the ferroelectric capacitor in the memory cell is read out to the bit line while the charge on the ferroelectric capacitor in the complementary memory cell is read out to the complementary bit line. The potentials on the paired bit lines are compared and amplified at a sense amp.

In the 1T1C system, on the other hand, the word line connected to a read-targeted cell is selected to connect the memory cell to a bit line. Thereafter, a plate voltage is applied to a plate line connected to the memory cell, and a voltage is applied across the ferroelectric capacitor contained in the memory cell.

The charge on the ferroelectric capacitor in the memory cell is read out to the bit line while a reference voltage is generated from a reference voltage generator and applied to a complementary bit line paired with the bit line. The potentials on the paired bit lines are compared and amplified at a sense amp. The TC parallel unit serial connection type is also similar to the above except that a block selection transistor is used to select a memory cell block and a word line to select a memory cell.

The 1T1C system and the 2T2C system have respective advantages and disadvantages. Therefore, it is preferable if one ferroelectric memory can be configured to execute the 1T1C system and the 2T2C system selectively. JP2005-4811A proposes such the ferroelectric memory.

The selective execution of the 1T1C system and the 2T2C system requires two selection transistors (or block selection transistors) configured independently drivable for selecting a bit line pair. An execution of the 1T1C system requires one of the complementary bit lines used in data reading and the other used as a shield line.

Therefore, selection of a pair of bit lines requires the preparation of a set of (two) word lines paired, thereby causing an increase in the area of the memory cell array and thus the chip area.

SUMMARY OF THE INVENTION

In an aspect the present invention provides a semiconductor memory device, comprising: a first memory cell array including a plurality of arrayed memory cells each containing a ferroelectric capacitor, a first bit line and a second bit line arranged to read data out of the memory cell, selection lines arranged to selectively connect the memory cell to the first bit line or the second bit line, and a plate line arranged to apply a drive voltage to the ferroelectric capacitor; a second memory cell array including a plurality of arrayed memory cells each containing a ferroelectric capacitor, a third bit line and a fourth bit line arranged to read data out of the memory cell, selection lines arranged to selectively connect the memory cell to the third bit line or the fourth bit line, and a plate line arranged to apply a drive voltage to the ferroelectric capacitor; a sense amp circuit operative to detect and amplify a potential difference caused between any two of the first through fourth bit lines; a decoupling circuit operative to selectively connect any two of the first through fourth bit lines to the sense amp circuit and decouple the remainder from the sense amp circuit; and a bit-line potential control circuit arranged between the decoupling circuit and the first and second memory cell arrays and operative to fix the voltage of the bit lines decoupled from the sense amp circuit by the decoupling circuit to a first potential, the bit lines being among the first through fourth bit lines.

DETAILED DESCRIPTION OF THE EMBODIMENTS

The embodiments of the invention will now be described with reference to the drawings.

First Embodiment

Figure 1:
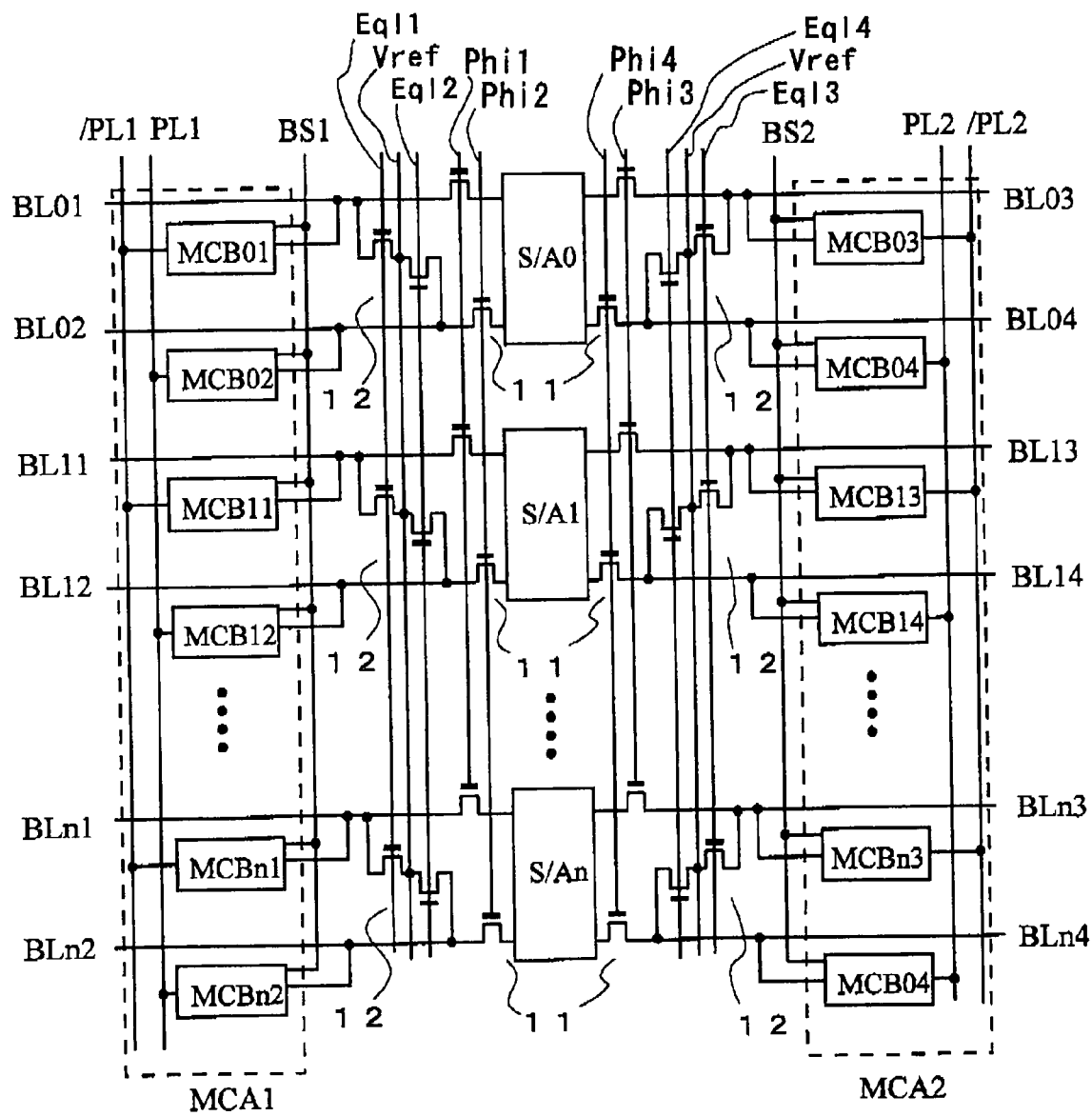
FIG. 1 shows circuitry of a ferroelectric memory according to a first embodiment of the present invention.
Figure 2:
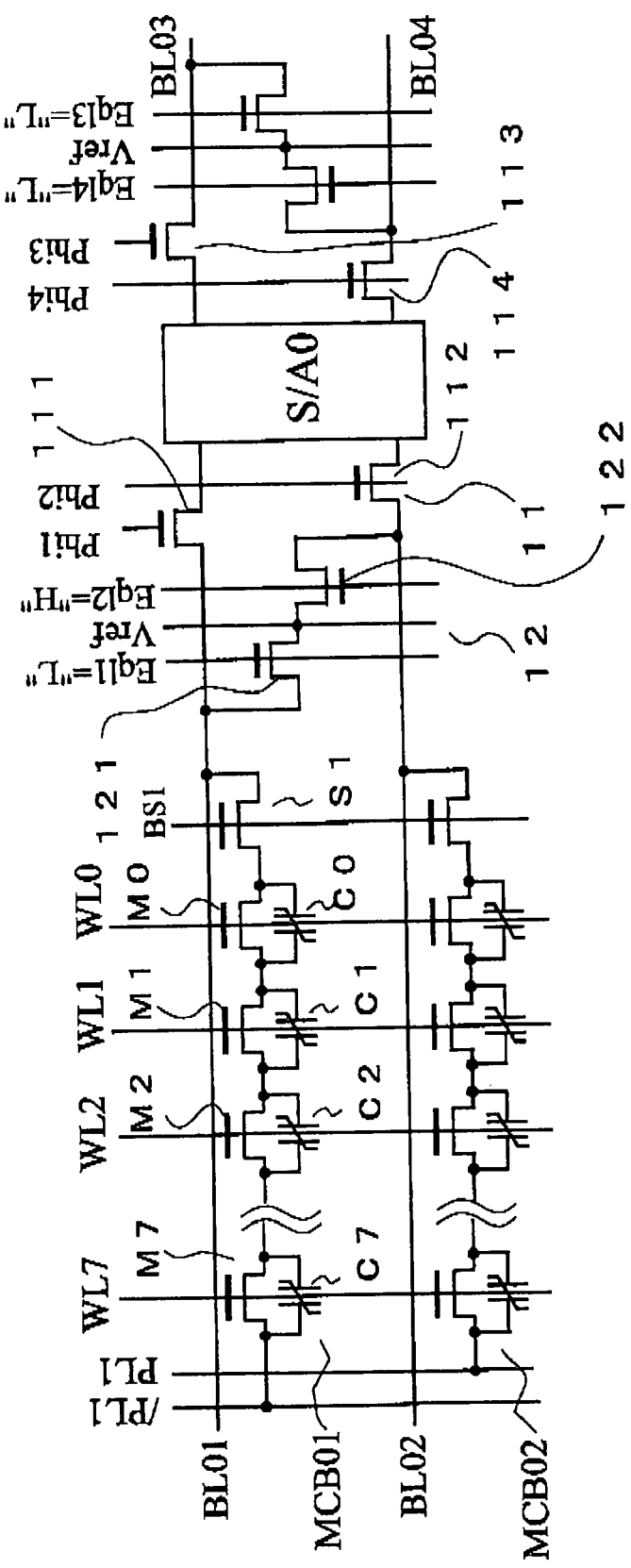
FIG. 2 is a circuit diagram showing a configuration of a memory cell block MCBij, a decoupling circuit 11 and a bit-line potential control circuit 12.

FIG. 1 shows circuitry of a ferroelectric memory of the TC parallel unit serial connection type according to a first embodiment of the present invention. FIG. 2 shows a configuration of a memory cell block MCB of the TC parallel unit serial connection type contained in a memory cell array of FIG. 1.

The ferroelectric memory comprises two memory cell arrays MCA1, MCA2 arranged laterally symmetrical as shown in FIG. 1. The memory cell array MCA includes an array of plural memory cell blocks MCB of the TC parallel unit serial connection type. FIG. 1 typically shows only one vertical row of memory cell blocks MCB for simplicity though the array of memory cell blocks is not limited to this example but rather memory cell blocks can be arrayed over plural rows.

The memory cell array MCA also includes word lines WL for selecting among memory cells, plate lines PL, /PL, and bit lines BL for reading data out of memory cells.

Referring to FIG. 2, a configuration of the memory cell block MCB is described. All the memory cell blocks MCB have the similar configuration and accordingly a memory cell block MCB01 connected to a bit line BL01 is described herein by way of example.

The memory cell block MCB01 comprises plural (8 in this example) serially connected memory cells each including a cell transistor or n-type MOS transistor Mi (i=0-7) and a ferroelectric capacitor Ci (i=0-7) connected in parallel. The transistor Mi has a gate connected to a word line WLi.

A ferroelectric capacitor C7 located at one end of the memory cell block MCB01 has a plate electrode, which is connected to the plate line PL1 for applying a drive voltage. The other end of the memory cell block MCB01 is connected via a block selection transistor S1 to the bit line BL01. The block selection transistor S1 is on/off controlled with a block selection signal BS1.

In the memory cell block MCB01, all word lines WLi (i=0-7) are made "H" at the time of standby so that no voltage is applied to every ferroelectric capacitor Ci. In contrast, only a word line associated with a read-targeted memory cell, for example, a word line WL0 is made "L" for data read. In this case, a voltage is applied across the ferroelectric capacitor C0 such that the cell data held in the ferroelectric capacitor C0 causes a corresponding voltage on the bit line BL01, which enables data read. Other memory cell blocks MCB also have the similar configuration.

Referring again to FIG. 1 for further description, there are provided plural sense amp circuits S/Ai (i=0, 1, . . . , n) between the memory cell arrays MCA1 and MCA2 as in the so-called shared sense amp format. The sense amp circuits S/Ai are connected to four bit lines BLij (j=1-4: first through fourth bit lines).

The bit lines BLi1 and Bli2 configure a bit line pair for execution of the 2T2C system. The bit lines BLi3 and BLi4 configure a bit line pair for execution of the 2T2C system. As described later, the bit lines BLi1 and BLi4 in combination or the bit lines BLi2 and BLi3 in combination configure a bit line pair for execution of the 1T1C system.

The bit line BLij can be connected to the memory cell block MCBij when the selection transistor S1 is turned on. The sense amp circuit S/Ai may include a comparator and a reference potential generation circuit as described later.

In this embodiment, all memory cell blocks MCB present in one memory cell array MCA1 (or 2) are configured selectable with a single block selection signal BS1 (or 2). Therefore, the area of the memory cell array can be reduced.

In the case of one memory cell array MCA1 provided with a single block selection signal (BS1 or BS2), in order to make not only the 2T2C system but also the 1T1C system executable, the present embodiment comprises a decoupling circuit 11. The decoupling circuit 11 includes four n-type MOS transistors 111-114, which are connected to the bit lines BLi1-4, on four bit lines BLi1-4 as shown in FIG. 2.

The transistors 111-114 are supplied with respective control signals Phi1-4 on gates thereof and on/off controlled. Thus, the bit lines BLi1-4 are selectively coupled to or decoupled from the sense amp circuit S/Ai.

A bit-line potential control circuit 12 is used to control the bit line decoupled from the sense amp circuit S/Ai by the decoupling circuit 11 such that the potential thereon can be charged up to a certain potential, specifically the same potential as the drive voltage applied to the plate line PL.

The bit-line potential control circuit 12 includes n-type MOS transistors 121, 122 as shown in FIG. 2. The transistors 121, 122 each have one end applied with the reference potential Vref, the other end connected to the bit line BLi1-4, and a gate given a control signal Eq11-4. The control signals Eq11-4 are independent signals.

Figure 3:
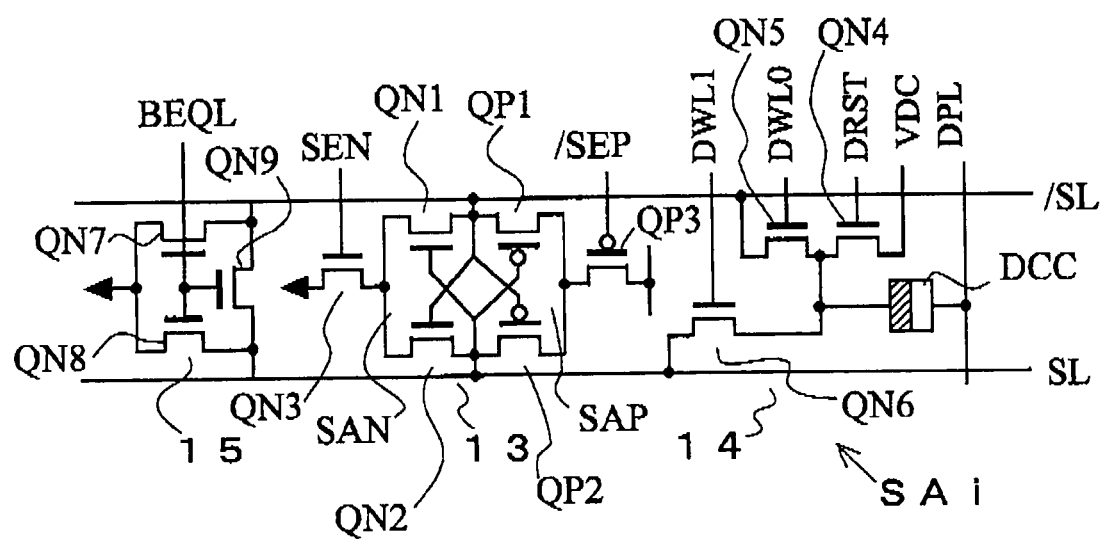
FIG. 3 is a circuit diagram showing a configuration example of a sense amp circuit S/Ai.

FIG. 3 shows circuitry of the sense amp circuit S/Ai in detail. The sense amp circuit S/Ai includes a sense amp (comparator) 13, a reference potential generation circuit 14, and a discharge circuit 15.

The sense amp 13 comprises a p-type sense amp SAP including p-type MOS transistors QP1-QP3, and an n-type sense amp SAN including n-type MOS transistors QN1-QN3. The p-type sense amp SAP and the n-type sense amp SAN are controlled with respective sense amp enable signals /SEP, SEN to operate.

The p-type MOS transistors QP1, QP2 contained in the p-type sense amp SAP are serially connected between paired sense lines SL, /SL and connected at gates thereof to the paired sense lines SL, /SL to configure a flip-flop circuit. The paired sense lines SL, /SL are such lines that are selectively connected to the bit lines BLi1-4 by the decoupling circuit 11.

A p-type MOS transistor QP3 is connected between a common connection point of both p-type MOS transistors QP1, QP2 and a supply voltage VAA. The p-type MOS transistor QP3 has a gate supplied with the sense amp enable signal /SEP to on/off control the p-type sense amp SAP.

The n-type MOS transistors QN1, QN2 contained in the n-type sense amp SAN are serially connected between the paired sense lines SL, /SL and connected at gates thereof to the paired sense lines SL, /SL to configure a flip-flop circuit.

An n-type MOS transistor QN3 is connected between a common connection point of both n-type MOS transistors QN1, QN2 and the ground potential GND. The n-type MOS transistor QN3 has a gate supplied with the sense amp enable signal SEN to on/off control the n-type sense amp SAN.

The reference potential generation circuit 14 includes a reset transistor QN4, selection transistors QN5, QN6, and a dummy capacitor DCC. The selection transistor QN5 is connected between the sense line /SL and one end of the dummy capacitor DCC. The selection transistor QN6 is connected between the sense line SL and one end of the dummy capacitor DCC.

The other end of the dummy capacitor DCC is given a dummy plate potential DPL. Both selection transistors QN5, QN6 have respective gates connected to dummy word lines DWL0, DWL1.

The reset transistor QN4 has one end connected to one end of the dummy capacitor DCC and the other end given the reference potential VDC. Thus, one end of the dummy capacitor DCC is reset to the reference potential VDC with a reset signal DRST. Of the dummy word lines DWL0, DWL1, one corresponding to the complementary bit line is made "H" to apply the reference potential to the complementary bit line.

The discharge circuit 15 includes n-type MOS transistors QN7, QN8 connected between the sense line SL or /SL and the ground potential Vss, and an n-type MOS transistor QN9 connected between the paired sense lines SL and /SL. These transistors QN7-9 have respective gates given a control signal BEQL. After sensing by the sense amp 13, the control signal BEQL turns to "H" to discharge the sense lines SL, /SL to the ground potential.

With the above configuration, the ferroelectric memory of the present embodiment can selectively execute either the 2T2C system or the 1T1C system.

In the case of data read/write by the 2T2C system, the control signals are made Phi1=Phi2="H" and Phi3=Phi4="L" or Phi1=Phi2="L" and Phi3=Phi4="H". Namely, the bit line only in either the memory cell amp MCA1 or MCA2 is connected to the sense amp circuit S/Ai to read cell data and complementary data, as in the case of read/write in a format like the so-called folded structure.

In the case of data read/write by the 1T1C system, the control signals are made Phi1=Phi4="H" and Phi2=Phi3="L" or Phi1=Phi4="L" and Phi2=Phi3="H". Namely, the bit lines extending one by one from both the memory cell array MCA1, MCA2 are connected to the sense amp circuit S/Ai to execute read/write in a format like the so-called open line system.

Figure 4:
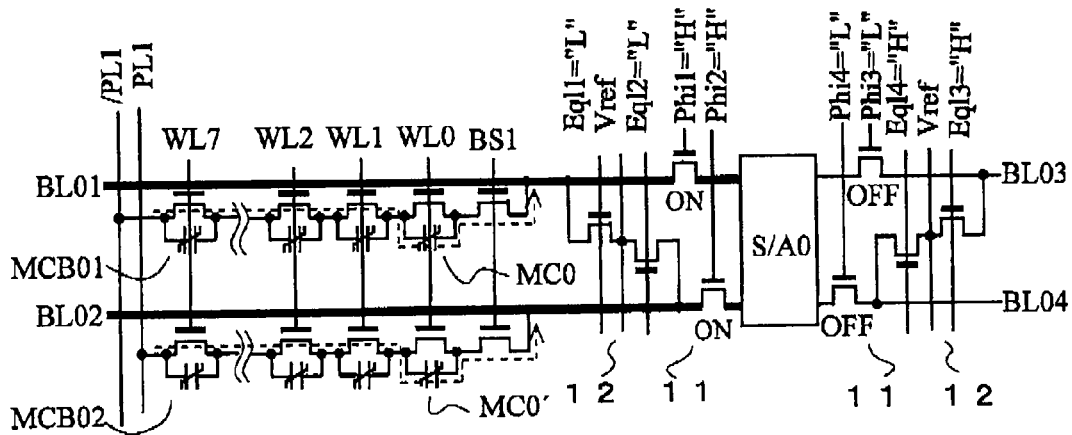
FIG. 4 illustrates operation in data reading by the 2T2C system in the ferroelectric memory of the first embodiment of the present invention.
Figure 5:
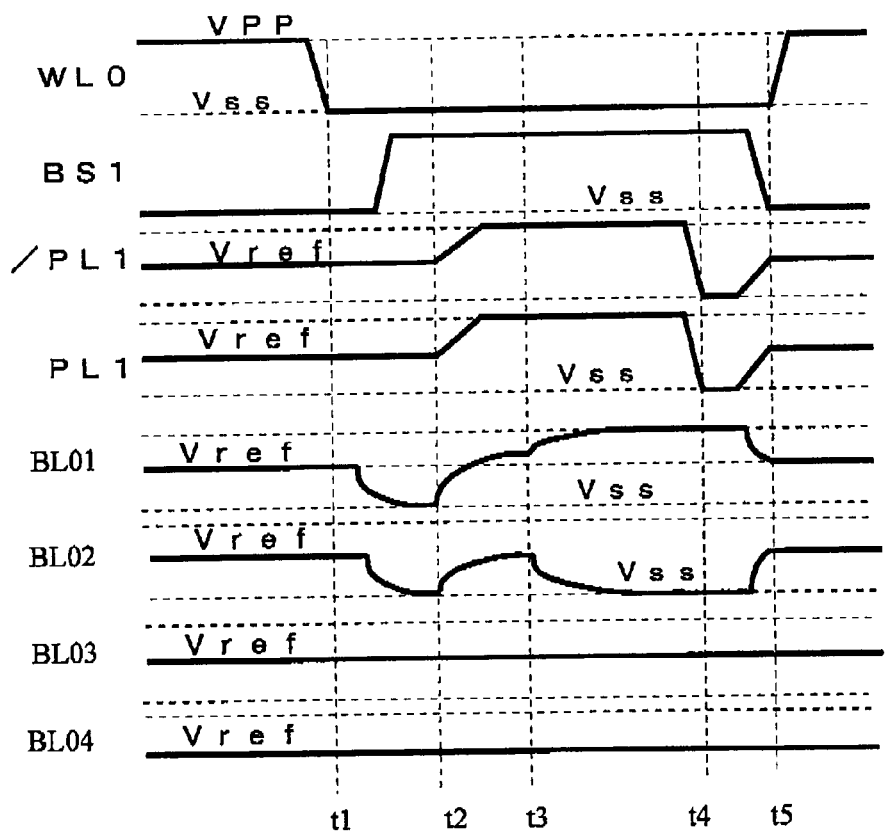
FIG. 5 illustrates operation in data reading by the 2T2C system in the ferroelectric memory of the first embodiment of the present invention.

Reading data by the 2T2C system is described first with reference to FIGS. 4 and 5. In the below described example, the control signals are made Phi1=Phi2="H" and Phi3=Phi4="L" to read data out of the memory cell amp MCA1.

First, in order to select a read-targeted memory cell MC0 from the memory cell block MCB01, the word line WL0 is set at "L" at time t1 (while retaining other word lines WL1-7 at "H") and then the block selection signal BS1 is set at "H". As a result, the read-targeted memory cell MC0 is connected to the bit line BL01.

On the other hand, in the memory cell block MCB02, a memory cell MC0' operative to store complementary data is connected to the bit line BL02. The potentials on the bit lines BL01, BL02 set at the reference potential Vref in the initial state are once discharged to the ground potential Vss.

Subsequently, the plate lines PL, /PL are brought from the reference potential Vref to the supply voltage VAA at time t2 to apply the supply voltage VAA across the ferroelectric capacitors contained in the memory cells MC0, MC0'. This enables the charge to be read out of the ferroelectric capacitors in the memory cells MC0, MC0' to the bit lines BL01, BL02.

The bit lines BL01, BL02 are given potentials in accordance with the data held in the memory cells MC0, MC0'. The potential difference between the bit lines BL01, BL02 can be compared/amplified when the sense amp 13 is activated at time t3.

Thereafter, the potentials on the plate lines PL, /PL are once fallen to the ground potential Vss at time t4, thereby rewriting data in the cell, which has been "1" read, that is, destructively read. The potentials on the plate lines PL, /PL are returned to the reference potential Vref at time t5.

In addition, the block selection signal BS1 returns to "L" to terminate read operation. The bit lines BL03, BL04 in the memory cell array MCA2 decoupled from the sense amp circuit S/Ai by the decoupling circuit 11 are both retained at the potential Vref after the control signals Eq13, 14 are made "H" at the bit-line potential control circuit 12. The control signals Eq11, Eq12 from the bit-line potential control circuit 12 close to the bit lines BL01, BL02 are both made "L".

Figure 6:
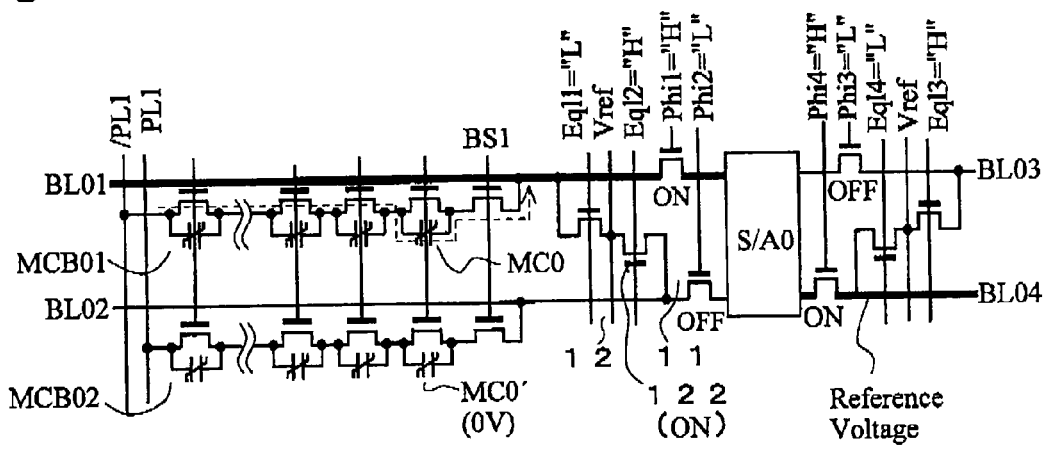
FIG. 6 illustrates operation in data reading by the 1T1C system in the ferroelectric memory of the first embodiment of the present invention.
Figure 7:
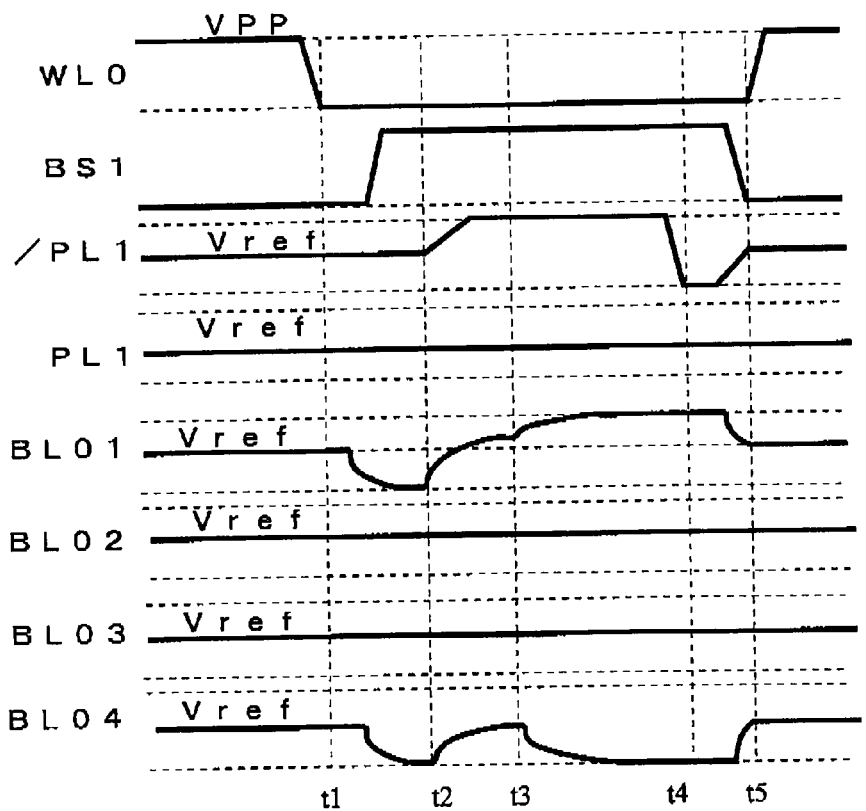
FIG. 7 illustrates operation in data reading by the 1T1C system in the ferroelectric memory of the first embodiment of the present invention

Reading data by the 1T1C system is described first with reference to FIGS. 6 and 7. In the below described example, the control signals are made Phi1=Phi4="H" and Phi2=Phi3="L" to read data out of the memory cell in the memory cell block MCB01 to the bit line BL01. The data is compared with the reference potential, which is generated from the reference potential circuit 14 and given to the bit line BL04 for data read.

First, in order to select a read-targeted memory cell MC0, the word line WL0 is set at "L" at time t1 (while retaining other word lines WL1-7 at "H") and then the block selection signal BS1 is set at "H". As a result, the read-targeted memory cell MC0 is connected to the bit line BL01.

On the other hand, in the memory cell block MCB02, a memory cell MC0' operative to store complementary data is connected to the bit line BL02. In this case, though, the transistor 112 in the decoupling circuit 11 is turned off with the control signal Phi2="L" and accordingly decoupled from the sense amp circuit S/Ai. Further, in the bit-line potential control circuit 12, the transistor 122 is turned on with the control signal Eq12="H" to charge the bit line BL02 up to the same potential on the plate line PL or the reference potential Vref. Therefore, no voltage is placed across the memory cell MC0', thereby preventing data read out of the memory cell MC0' and destruction of data.

Thereafter, the voltage on the plate line /PL connected close to the memory cell block MCB01 is elevated to the supply voltage VAA at time t2. As a result, the supply voltage VAA is applied across the ferroelectric capacitor contained in the memory cell MC0 and the charge flows from the ferroelectric capacitor C0 in the memory cell MC0 to the bit line BL01.

On the other hand, the voltage on the plate line PL remains at Vref after the time T2 and the bit line BL02 is also fixed to the reference potential Vref by the bit-line potential control circuit 12. Therefore, the potential difference between both ends of the ferroelectric capacitor in the memory cell MC0' is equal to zero. Accordingly, no data is read out of the memory cell MC0' and data in the memory cell MC0' can not be destructed.

The potential on the bit line BL01 is compared with the reference potential given to the bit line BL04 from the reference potential generation circuit 14 and amplified at the sense amp 13. The bit line BL04 is connected to the sense amp circuit S/Ai and accordingly the balance between the bit line capacities on the paired complementary bit lines (BL01, BL04) can be retained, thereby enhancing the read margin.

The potential on the bit line BL03 decoupled from the sense amp circuit S/A by the decoupling circuit 11 is fixed to the reference potential Vref by the bit-line potential control circuit 12 (the control signal is made Eq13="H") to serve as a shield line.

As described above, the present embodiment makes it possible to execute not only the 2T2C system but also 1T1C system even if one memory cell array MCA includes only a single block selection line. With this configuration, the memory cell array can reduce the area of the memory cell array in accordance with the lowered number of the block selection line.

Second Embodiment

Figure 8:
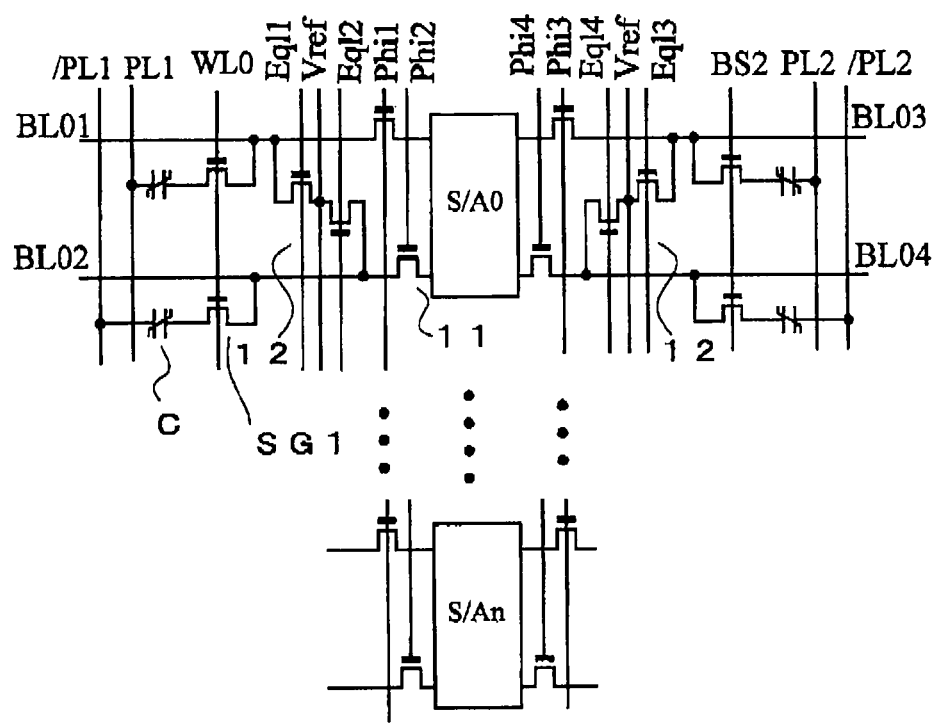
FIG. 8 shows circuitry of a ferroelectric memory according to a second embodiment of the present invention of the present invention.

FIG. 8 shows circuitry of a ferroelectric memory according to a second embodiment of the present invention. The same elements as those in the first embodiment are denoted with the same reference numerals and omitted from the following detailed description. FIG. 8 typically shows only one sense amp circuit S/A0 and bit lines BL01-04 connected thereto, of the configuration of the ferroelectric memory.

In this ferroelectric memory, each memory cell includes a ferroelectric capacitor C, and a selection transistor SG1 serially connected thereto and having a gate connected to the word line WL. The memory cell is connected to one bit line BL01-04, in place of the connection of the memory cell block of the TC parallel units as in the first embodiment.

The ferroelectric capacitor C has one end connected to plate lines PL1, /PL1. In one memory cell array MCA, memory cells aligned in the same row are configured to share a word line WL and simultaneously selectable by selecting the word line WL. Therefore, the area of the memory cell array can be reduced in accordance with the lowered number of the word lines.

Even if memory cells aligned in the same row include only a single word line, it is possible to execute not only the 2T2C system but also 1T1C system if the decoupling circuit 11 similar to that in the first embodiment is provided as above.

Operation is executed almost in the same manner as that in the first embodiment. Namely, in the case of data read/write by the 2T2C system, the control signals are made Phi1=Phi2="H" and Phi3=Phi4="L" or Phi1=Phi2="L" and Phi3=Phi4="H". On the other hand, in the case of data read/write by the 1T1C system, the control signals are made Phi1=Phi4="H" and Phi2=Phi3="L" or Phi1=Phi4="L" and Phi2=Phi3="H". The plate lines PL1, /PL1 are also driven in the same manner as those shown in FIGS. 5 and 7.

Third Embodiment

Figure 9:
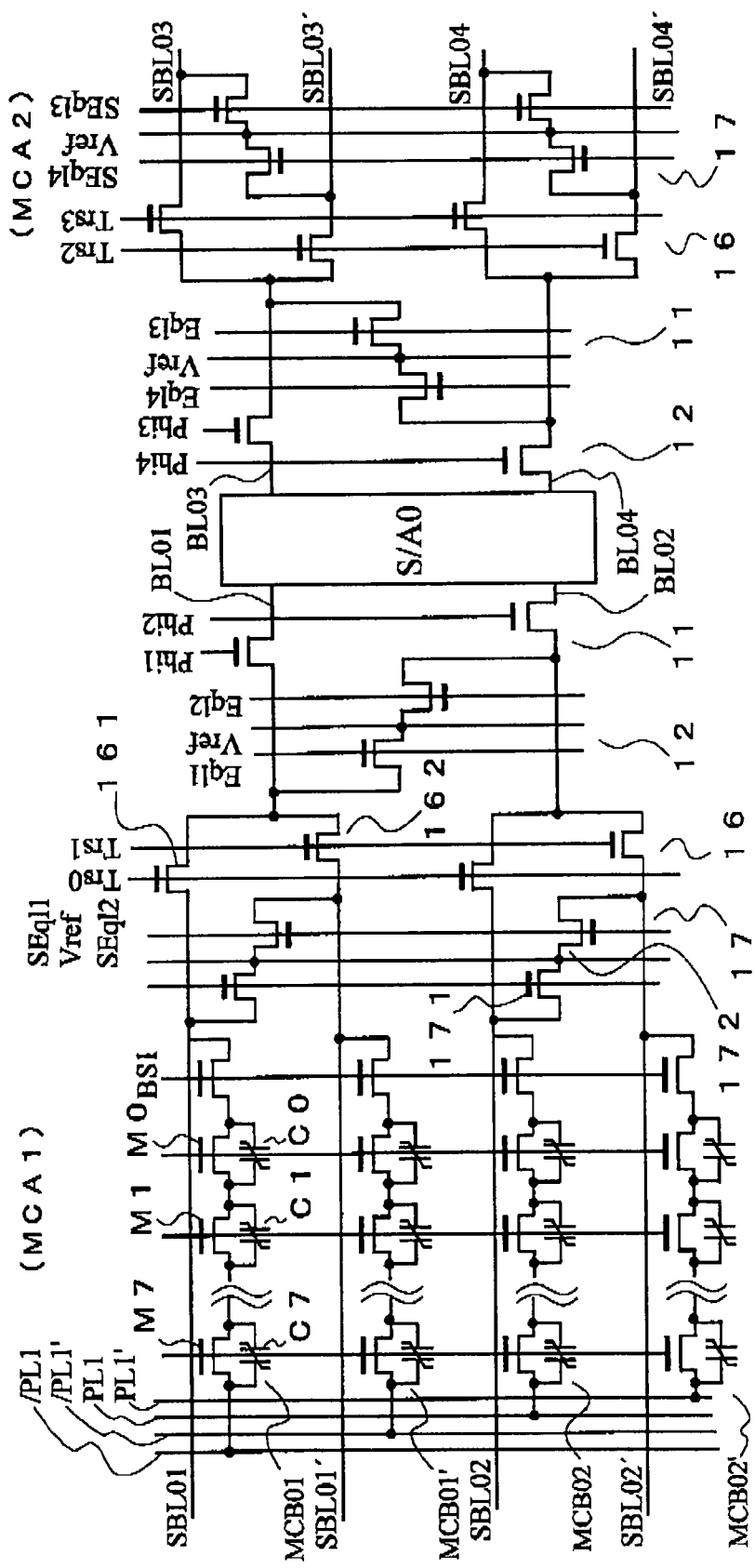
FIG. 9 shows circuitry of a ferroelectric memory according to a third embodiment of the present invention of the present invention.

FIG. 9 shows circuitry of a ferroelectric memory according to a third embodiment of the present invention. The same elements as those in the first embodiment are denoted with the same reference numerals and omitted from the following detailed description. FIG. 9 typically shows only one sense amp circuit S/A0 and bit lines BL01-04 connected thereto, of the configuration of the ferroelectric memory.

In this embodiment, two sub-bit lines SBLij, SBLij' extend from each of four bit lines BLij (j=1-4) connected to one sense amp circuit S/Ai, different from the above-described embodiments. Namely, any two of eight sub-bit lines can be connected to one sense amp circuit S/Ai via the bit line BLij. The sub-bit lines SBLij, SBLij' are connected to the memory cell blocks MCBij, MCBij' similar to those in the first embodiment (the memory cell block close to the memory cell array MCA2 is omitted from FIG. 9).

A sub-decoupling circuit 16 is provided between the sub-bit lines SBLij, SBLij' and the bit line SBLij. The sub-decoupling circuit 16 includes an n-type MOS transistor 161 and an n-type MOS transistor 162 for one bit line BLij. The n-type MOS transistor 161 is connected between the sub-bit line SBLij and the bit line BLij and turned on when a control signal Trs0 is given to the gate thereof. The n-type MOS transistor 162 is connected between the sub-bit line SBLij' and the bit line BLij and turned on when a control signal Trs1 is given to the gate thereof.

When either of the control signals Trs0, Trs1 is made "H", one of the sub-bit lines SBLij, SBLij' is selectively connected to the bit line BLij and the other is decoupled from the bit line BLij and the sense amp S/Ai.

The sub-bit lines SBLij, SBLij' are provided with a sub-bit line potential control circuit 17. The sub-bit line potential control circuit 17 includes n-type MOS transistors 171, 172 as shown in FIG. 9. The transistors 171, 172 each have one end supplied with the reference voltage Vref, the other end connected to the sub-bit line SBLij, SBLij', and a gate given a control signal SEq1j. The control signals SEq1j are independent signals.

The present embodiment is thus provided with the decoupling circuit 11 and the sub-decoupling circuit 16 so that one bit line BLij can be connected selectively to either of two memory cell blocks MCBij, MCBij'. Namely, one sense amp circuit S/Ai can be connected to eight memory cell blocks. When the decoupling circuit 11 and the sub-decoupling circuit 16 are switched, either of the 2T2C system and the 1T1C system can be executed selectively like the above embodiments.

The embodiments of the invention have been described above though the present invention is not limited to these embodiments but rather can be given various modifications, additions, replacements and deletions without departing from the scope and spirit of the invention.

For example, the above embodiments employ the plate line drive system for varying the plate line voltage to execute data read/write to memory cells. A plate line fixation system for retaining the plate line voltage unchanged while discharging the bit line voltage to execute data read/write may also be applicable to the present invention.

What is claimed is:
1. A semiconductor memory device, comprising:
a first memory cell array including
a plurality of arrayed memory cells each containing a ferroelectric capacitor,
a first bit line and a second bit line arranged to read data out of said memory cells,
selection lines arranged to selectively connect said memory cell to said first bit line or said second bit line, and
a plate line arranged to apply a drive voltage to said ferroelectric capacitor;
a second memory cell array including
a plurality of arrayed memory cells each containing a ferroelectric capacitor,
a third bit line and a fourth bit line arranged to read data out of said memory cells, selection lines arranged to selectively connect said
memory cell to said third bit line or said fourth bit line,
and
a plate line arranged to apply a drive voltage to said
ferroelectric capacitor;
a sense amp circuit operative to detect and amplify a potential difference caused between any two of said first
through fourth bit lines;
a decoupling circuit operative to selectively connect any
two of said first through fourth bit lines to said sense amp
circuit and decouple the remainder from said sense amp
circuit; and
a bit-line potential control circuit arranged between said
decoupling circuit and said first and second memory cell
arrays and operative to fix the voltage of said bit lines
decoupled from said sense amp circuit by said decoupling circuit to a first potential, the bit lines being among
said first through fourth bit lines.

2. The semiconductor memory device according to claim 1, wherein said decoupling circuit selectively connects said sense amp to one of:
a first combination of said first bit line and said fourth bit line;
a second combination of said second bit line and said third bit line;
a third combination of said first bit line and said second bit line; and
a fourth combination of said third bit line and said fourth bit line.

3. The semiconductor memory device according to claim 2, wherein
said third combination or said fourth combination is selected when read/write is executed in a 2T2C system using two of said memory cells connectable to different bit lines to store complementary data,
while said first combination or said second combination is selected when read/write is executed in a 1T1C system using one of said memory cell to store data.

4. The semiconductor memory device according to claim 3, wherein
said first through fourth bit lines decoupled by said decoupling circuit are charged up to a certain voltage to serve as shield lines when said first combination or said second combination is selected.

5. The semiconductor memory device according to claim 1, wherein said memory cell connected to said first bit line and said memory cell connected to said second bit line are selected with the same said selection line and connected to said first bit line or said second bit line,
wherein said memory cell connected to said third bit line and said memory cell connected to said fourth bit line are selected with the same said selection line and connected to said third bit line or said fourth bit line.

6. The semiconductor memory device according to claim 5, wherein said decoupling circuit selectively connects said sense amp to one of:
a first combination of said first bit line and said fourth bit line;
a second combination of said second bit line and said third bit line;
a third combination of said first bit line and said second bit line; and
a fourth combination of said third bit line and said fourth bit line.

7. The semiconductor memory device according to claim 1, wherein
each of said first through fourth bit lines is connectable with a plurality of sub-bit lines,
the device further comprising a sub-decoupling circuit operative to selectively connect any one of said plurality of sub-bit lines to said first through fourth bit lines.

8. The semiconductor memory device according to claim 7, wherein said decoupling circuit selectively connects said sense amp to one of:
a first combination of said first bit line and said fourth bit line;
a second combination of said second bit line and said third bit line,
a third combination of said first bit line and said second bit line; and
a fourth combination of said third bit line and said fourth bit line.

9. The semiconductor memory device according to claim 8, wherein
said third combination or said fourth combination is selected when read/write is executed in a 2T2C system using two of said memory cells connectable to different bit lines to store complementary data,
while said first combination or said second combination is selected when read/write is executed in a 1T1C system using one of said memory cell to store data.

10. The semiconductor memory device according to claim 1, wherein
one memory cell further contains a cell transistor connected in parallel with said ferroelectric capacitor, wherein plural such memory cells are serially connected to configure a memory cell block, with a block selection transistor connected to one end of said memory cell block to select said memory cell block.

11. The semiconductor memory device according to claim 10, wherein
all memory cell blocks in said first memory cell array or said second memory cell array are configured selectable with a single block selection signal line.

12. The semiconductor memory device according to claim 10, wherein said decoupling circuit selectively connects said sense amp to one of:
a first combination of said first bit line and said fourth bit line;
a second combination of said second bit line and said third bit line;
a third combination of said first bit line and said second bit line; and
a fourth combination of said third bit line and said fourth bit line.

13. The semiconductor memory device according to claim 12, wherein
said third combination or said fourth combination is selected when read/write is executed in a 2T2C system using two of said memory cells connectable to different bit lines to store complementary data,
while said first combination or said second combination is selected when read/write is executed in a 1T1C system using one of said memory cell to store data.

14. The semiconductor memory device according to claim 13, wherein said first through fourth bit lines decoupled by said decoupling circuit are charged up to a certain voltage to serve as shield lines when said first combination or said second combination is selected.

* * * * *